United States Patent [19]

Redlich

[11] 4,409,544

[45] Oct. 11, 1983

[54] INSTRUMENTS FOR MEASUREMENT OF CARRIER POWER AND ANTENNA IMPEDANCE IN AM BROADCASTING

[76] Inventor: Robert W. Redlich, 9 Grand Park Blvd., Athens, Ohio 45701

[21] Appl. No.: 256,782

[22] Filed: Jul. 6, 1981

[51] Int. Cl.³ .......................................... G01R 27/04
[52] U.S. Cl. ................................. 324/57 R; 343/703
[58] Field of Search ................. 455/67, 115; 343/703; 324/57 R

[56] References Cited

U.S. PATENT DOCUMENTS

| | | | |
|---|---|---|---|
| 3,825,825 | 7/1974 | Smolka | 324/57 R |
| 4,071,819 | 1/1978 | DeSantis | 324/57 R X |
| 4,257,123 | 3/1981 | Birt | 455/67 X |

OTHER PUBLICATIONS

Maeda I: "Multifrequency LCR Meters . . . "-hp Journal-Feb. 79, pp. 24-32.
Maeda II: "An Automatic, Precision 1-MHZ Digital LCR Meter" hp Journal-Mar. 74, pp. 2-9.
Hashimoto: "An Automatic Wide-Range Digital LCR Meter" hp Journal-Sep. 76, pp. 9-16.
Reis: "Measurement of an Unknown Impedance . . . " IBM Tech. Disclosure Bulletin-vol. 24-No. 7A-Dec. 1981.

Primary Examiner—Stanley T. Krawczewicz
Assistant Examiner—Jose M. Solis

[57] ABSTRACT

Instruments to measure carrier power and antenna impedance in AM broadcasting, wherein power, resistance, and reactance are computed electrically from two radiofrequency sample voltages proportional to instantaneous current and voltage in a transmission line conveying power to the antenna system, and the results of computation are displayed as a digital readout.

2 Claims, 2 Drawing Figures

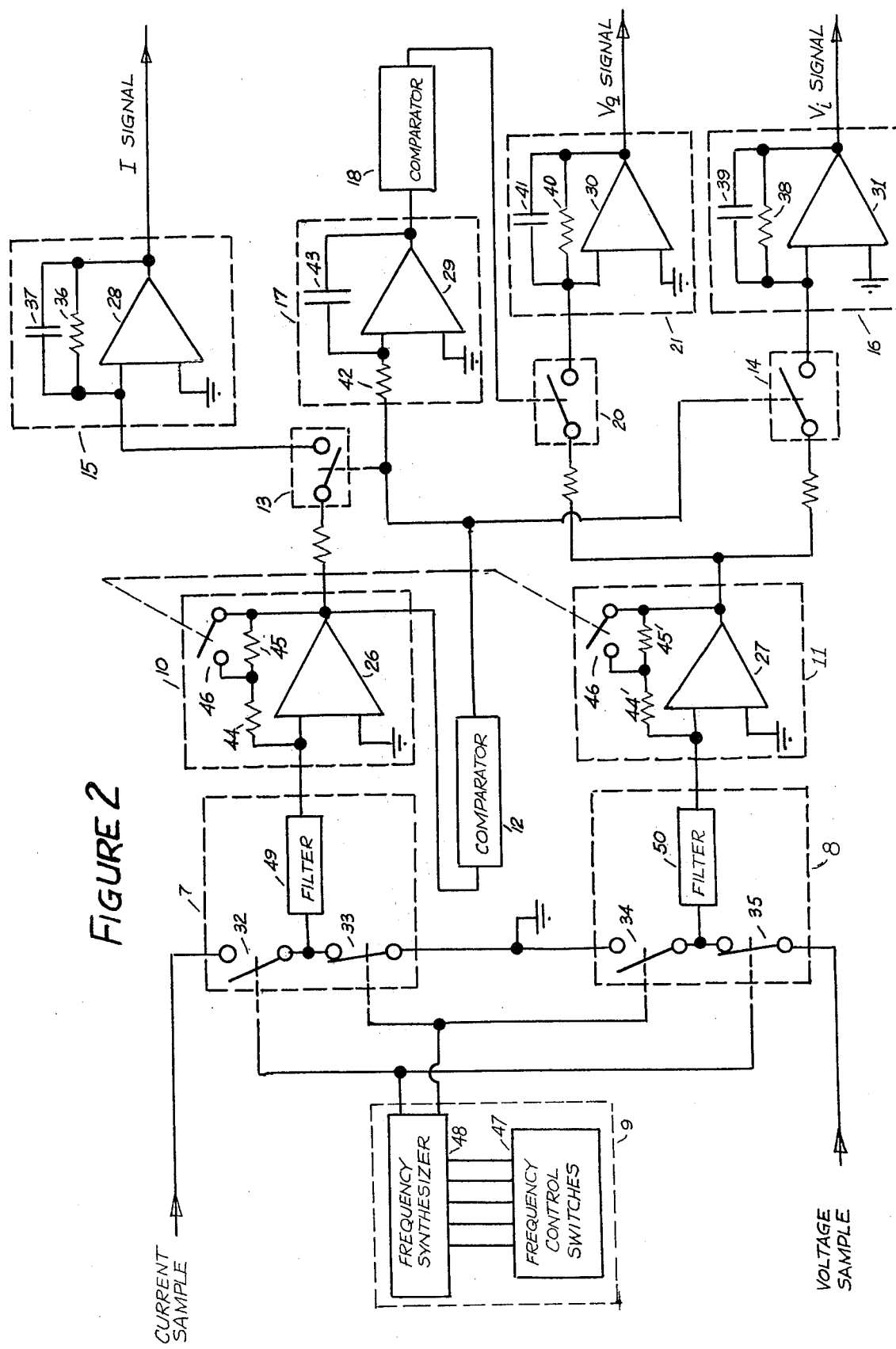

INSTRUMENTS FOR MEASUREMENT OF CARRIER POWER AND ANTENNA IMPEDANCE IN AM BROADCASTING

BACKGROUND OF THE INVENTION

In AM broadcasting in the United States, carrier power must be kept within legal limits, and F.C.C. regulations require periodic measurement of antenna impedance.

Required impedance measurements are generally made by a skilled technician using an impedance bridge and a signal generator. In the interval between measurements, which can be up to three years, antenna impedance is not known unless the station installs an inline impedance bridge, which requires a skilled operator. Antenna impedance is of interest to the station operators because it is a good indication of the status of the antenna system and because it is advantageous to maintain optimum antenna load on the transmitter. There is therefore a need for an instrument which will measure antenna impedance under operating conditions without requiring the services of a skilled technician, and it is one object of the present invention to provide such an instrument. It would be advantageous if the same instrument was capable of performing the periodic impedance measurements required by the F.C.C., which must be done at a number of different frequencies and therefore cannot use the transmitter as a signal source but require instead a low power signal generator. Thus it is a second object of the present invention to provide an instrument which can measure impedance both under operating conditions and with a low power signal generator replacing the transmitter as a signal source.

Carrier power measurement is presently accomplished, according to F.C.C. regulation, by methods which do not yield a number representing power directly, but instead require calculations, and involve assumptions about the parameters entering into these calculations, which assumptions are known to be inaccurate in practice. To remedy these defects, F.C.C. regulations will probably be changed to admit the legal use of direct reading power meters. Such meters are commercially available, but suffer from one or more of the following disadvantages; (a) sensitivity to modulation, which means that accurate power measurements can only be made during the short and infrequent intervals when the transmitter is not being modulated, (b) necessity to measure both forward and reverse power and obtain net power by subtraction, (c) implicit and not necessarily correct assumptions about antenna impedance, (d) lack of precision. There is therefore a need for an instrument which will directly measure carrier power under normal operating conditions including normal modulation, and it is a third object of the present invention to provide such an instrument. In the present invention, the quantities that enter into the determination of carrier power are the same as those which determine the resistive component of antenna impedance, hence the power measuring function can optionally be combined with the impedance measuring function in a single instrument.

SUMMARY OF THE INVENTION

In the present invention, the quantities to be measured, namely resistance (R), reactance (X), and carrier power (P) are computed electrically from the formulas:

$$R = V_i/I$$

$$X = V_q/I$$

$$P = V_i \times I$$

In these formulas,

I is a voltage proportional to carrier current magnitude in a transmission line connected between the transmitter (or signal generator) and the antenna load.

$V_i$ is a voltage that is proportional to the component of carrier voltage that is in-phase with carrier current, in the said transmission line.

$V_q$ is a voltage that is proportional to the component of carrier voltage that is in phase quadrature with carrier current, in the said transmission line.

I, $V_i$, and $V_q$ are obtained by synchronous detection and filtering of two radiofrequency (RF) sample voltages whose waveforms are scaled down replicas of the waveforms of carrier current and carrier voltage respectively, in the said transmission line.

The division operation required for computation of R or X is performed by an analog-to-digital converter of the well known "ratiometric" type (dual ramp or staircase, for example), which inherently generates a digital output proportional to the ratio of two analog signals. Part of the novelty of the present invention is believed to reside in the recognition and use of the fact that commercially available ratiometric analog-to digital converters are well adapted for performing the said division operation, and for presentation of the result of the division in a digital form that is readily interpreted by an unskilled operator.

A first embodiment is an instrument employing the foregoing principles in the measurement of impedance only. A second embodiment incorporates, in addition to the first embodiment, an analog multiplier to carry out the multiplication operation required in computation of power from I and $V_i$. Part of the novelty of the second embodiment is believed to reside in recognition and use of the fact that the same parameters which enter into calculation of R, namely I and $V_i$, can also be used for determination of power.

BRIEF DESCRIPTION OF THE DRAWINGS

FIG. 2 is a schematic diagram showing details of some of the circuits represented by blocks in FIG. 1.

DESCRIPTION OF PREFERRED EMBODIMENT

Figure 1:
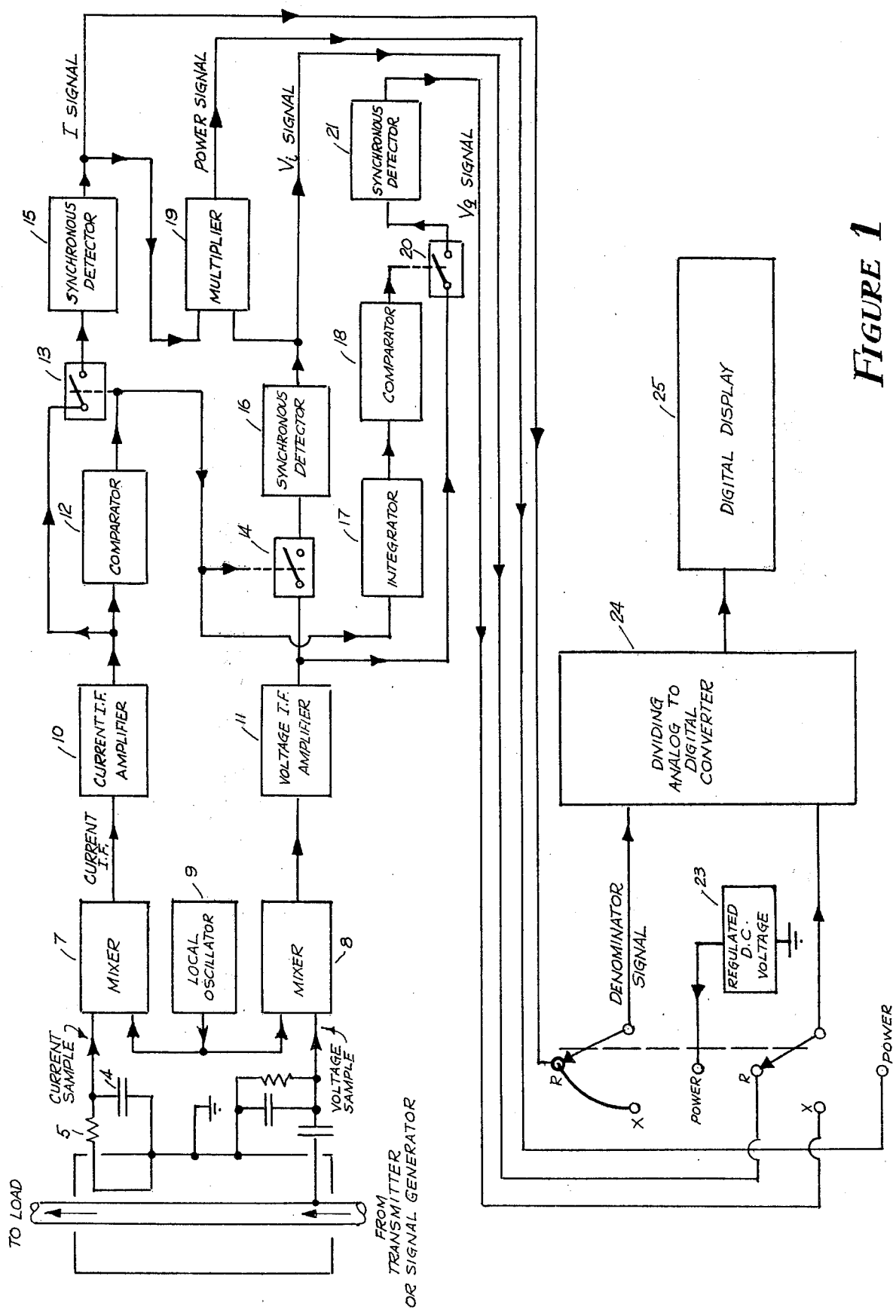
FIG. 1 is a block diagram of a preferred embodiment of both the impedance and power measurement functions. An embodiment for impedance measurement only would be illustrated by FIG. 1 with multiplier 19 deleted and switch 22 modified by deleting the positions labeled "power".

With reference to FIG. 1:

A coaxial transmission line section 1, connected between the AM transmitter (or a signal generator) and the antenna is fitted with a loop 2 inductively coupled to the center conductor of 1, so that a voltage is induced in 2 proportional to the RF current in 1. This induced voltage is supplied to capacitor 4 through resistor 5, whose purpose is to equalize frequency response and provide a "current sample" across 4 that is nearly independent of frequency.

A small capacitor 6 is connected between the center conductor of 1 and the parallel combination of resistor 5' and capacitor 4'. Capacitor 4' is much larger than capacitor 6, typically by a factor of 500–1000, in order to attenuate the RF voltage across transmission line 1 to a "voltage sample" of about 0.7 volts across capacitor 4'. Further, the nominal values of 4' and 5' are the same as those of 4 and 5, in order to make the frequency response of the voltage sample the same as that of the current sample.

The voltage and current samples are "heterodyned", that is, frequency shifted, to a lower carrier frequency, typically 15 khz., by mixers 8 and 7 respectively, which mixers employ a common local oscillator 9. Mixer outputs have the same impressed modulation as the original samples, and are in the same phase relationship. They are designated as "current I.F." and "voltage I.F." (I.F. abbreviates intermediate frequency), and are amplified by I.F. amplifiers 10 and 11 respectively. Heterodyning has two purposes; to change the frequency at which signal processing is performed to a single frequency independent of the sample frequency, and further, to permit signal processing at a frequency much lower than station frequency, with attendant simplicity, reduction in unwanted coupling, and precision.

Amplified current I.F. is supplied to a detector consisting of comparator 12, switch 13 whose closings are controlled by the output of comparator 12, and synchronous detector 15. The reference level for comparator 12 is ground and its input is current I.F., hence its output is a square wave whose transition times coincide with the zero crossings of the current I.F. signal. Therefore, switch 13 closes if and only if the current I.F. signal is positive, and the input to 15 is half wave rectified current I.F. signal. The output of 15, designated "I signal", is proportional to the mean value of the half wave rectified current I.F., hence to carrier current in transmission line 1.

Amplified voltage I.F. is supplied to a detector consisting of switch 14, whose closings are controlled by comparator 12, and synchronous detector 16. Since the output of comparator 12 is a square wave whose transitions coincide with the zero crossings of the current I.F., switch 13 connects voltage I.F. to the input of synchronous detector 16 during half of the I.F. period when current I.F. is positive. The output of synchronous detector 16, which is designated "$V_i$ signal", can readily be shown to be proportional to the mean value of the component of voltage I.F. that is in-phase with current I.F., hence proportional to the component of carrier voltage across transmission line 1 that is in-phase with carrier current in 1.

Amplified voltage I.F. is also the input to a detector consisting of switch 20 and synchronous detector 21. The closings of switch 20 are controlled by the output of comparator 18, whose input is a sawtooth voltage resulting from the integration of the output of comparator 12 by integrator 17. The output of comparator 18 is therefore a square wave whose transitions are displaced in time by one-quarter of an I.F. period from the zero crossings of current I.F., and this time displacement is maintained even when the current sample is amplitude modulated up to 100%. The output of synchronous detector 21, which is designated "$V_q$ signal", can readily be shown to be proportional to the mean value of the component of voltage I.F. that is in phase quadrature with current I.F., hence to the component of carrier voltage in transmission line 1 that is in phase quadrature with carrier current in 1.

Resistance and reactance of the load connected to transmission line 1 are determined by dividing the I signal into either the $V_i$ or $V_q$ signals respectively, by means of selector switch 22 and analog-to-digital (A/D) converter 24, which typically can be either of the well known "dual ramp" or "staircase" types, which inherently generate a digital output proportional to the ratio of two analog inputs designated "numerator signal" and "denominator signal".

The digital output of 24 is displayed by 25, which is a digital display typically of the light emitting diode or the liquid crystal type.

In a first embodiment of the invention, only impedance is measured by the instrument, and, with reference to FIG. 1; multiplier 19 is omitted, the upper section of switch 22 is omitted, I signal is permanently connected to the denominator input of A/D converter 24, and the position marked "power" of the lower section of switch 22 is omitted.

In a second embodiment, both impedance and power are measured by the instrument. I signal and $V_i$ signal are multiplied by 19, which is preferably of the integrated circuit analog type. The output of multiplier 19 is proportional to carrier power transmitted through 1, and is designated "power signal". With switch 22 in the position marked "power", power signal is the numerator input to 24, and the denominator input to 24 is a regulated D.C. voltage, hence the digital output of 24 is equal to the carrier power through transmission line 1.

With reference to FIG. 2, which shows details of some of the functional blocks of FIG. 1:

- 10,11,18,21,25, and 28 are operational amplifiers, each connected in a negative feedback configuration.
- 3,4,15, and 16 are electronic switches, preferably of the complementary metal oxide semiconductor (CMOS) type.
- 18, 19, and 20 comprise synchronous detector 15 of FIG. 1.
- 28, 29, and 30 comprise synchronous detector 16 of FIG. 1.
- 25, 26, and 27 comprise synchronous detector 21 of FIG. 1.
- 21, 22, and 23 comprise integrator 17 of FIG. 1.
- 7, 8 and 10 comprise current I.F. amplifier 10 of FIG. 1.
- 7', 8', and 11 comprise voltage I.F. amplifier 11 of FIG. 1. The nominal values of resistors 7' and 8' are equal to those of 7 and 8.

Two pole switch 9 is for the purpose of selecting gain so that the instrument can be used either under normal operating conditions (switch 9 closed, low gain setting), or with a low power signal generator (switch 9 open, high gain setting).

Frequency synthesizer 2 in combination with frequency control switches 1 comprise local oscillator 9 of FIG. 1. Use of a frequency synthesizer makes possible the periodic impedance measurements required by the F.C.C., which must be performed at a number of frequencies, spaced 5 kilohertz apart and extending to 25 kilohertz above and below the station frequency. For each of the required frequencies, frequency control switches 1 are set by the operator so that the output frequency of 2 is 15 kilohertz below the required frequency. For measurements under normal operating conditions, switches 1 are left at a setting such that the output frequency of 2 is 15 kilohertz below the station frequency.

Switches 3 and filter 5 comprise mixer 7 of FIG. 1.

Switches 4 and Filter 6 comprise mixer 8 of FIG. 1.

The outputs of synthesizer 2 are two complementary square waves which control the closings of switches 3 and 4. The input to filter 5 is switched alternately between the current sample and ground at a frequency differing from the current sample frequency by the I.F. frequency. Low-pass filter 5 passes only frequencies below the I.F. plus the highest modulation frequency impressed on the current sample. Therefore, the envelope of the output of filter 5 is the same as that of the current sample, but the carrier frequency within the envelope is the I.F. The output of filter 5 is the "current I.F." of FIG. 1. Similarly, the output of filter 6 is the "voltage I.F." of FIG. 1.

I claim:

1. In an instrument for measuring the resistance and reactance of the antenna load on an AM broadcasting transmitter, the combination of;

heterodyning, long time-constant detection means for obtaining voltages I, $V_i$, and $V_q$ that are proportional respectively to the magnitudes of carrier current, the component of carrier voltage that is in-phase with carrier current, and the component of carrier voltage that is in phase quadrature with carrier current, said carrier voltages and currents being those that exist in a transmission line between an AM broadcasting transmitter and its antenna load, a dividing analog to digital converter having numerator and denominator inputs, with said voltage I impressed at all times on the denominator input, and said voltages $V_i$ and $V_q$ impressed selectively by means of a switch on the numerator input, so that the analog to digital converter is a digital signal proportional respectively to resistance and reactance of the antenna load.

2. In an instrument for measuring resistance and reactance of the antenna load on an AM broadcasting transmitter, and the carrier power supplied to the antenna load, the combination of;

heterodyning, long time-constant detection means for obtaining voltages I, $V_i$, and $V_q$ that are proportional respectively to the magnitudes of carrier current, the component on carrier voltage that is in-phase with carrier current, and the component of carrier voltage that is in phase quadrature with carrier current, said carrier voltage and currents being those that exist in a transmission line between an AM broadcasting transmitter and its antenna load, multiplying means to produce a voltage P that is proportional to the product of said voltages I and $V_i$, a dividing analog to digital converter having numerator and denominator inputs, a two pole, three position switch, with first pole connected to numerator input of said analog to digital converter, second pole connected to denominator input of said analog to digital converter, first switch position such that first pole is connected to said voltage $V_i$ and second pole is connected to said voltage I, second switch position such that first pole is connected to said voltage $V_q$ and second pole is connected to said voltage I, and third switch position such that first pole is connected to said voltage P and second pole is connected to a regulated DC voltage, so that the output of said analog to digital converter is proportional respectively to resistance of antenna load, reactance of antenna load, and carrier power supplied to antenna load.

* * * * *